(12) United States Patent
Morishima et al.

(10) Patent No.: US 8,722,184 B2
(45) Date of Patent: May 13, 2014

(54) WAFER-ADHERING ADHESIVE TAPE

(75) Inventors: Yasumasa Morishima, Tokyo (JP); Kenji Kita, Tokyo (JP); Shinichi Ishiwata, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 887 days.

(21) Appl. No.: 12/058,170

(22) Filed: Mar. 28, 2008

(65) Prior Publication Data

US 2008/0299345 A1 Dec. 4, 2008

Related U.S. Application Data

(63) Continuation of application No. 11/184,001, filed on Jul. 19, 2005, now abandoned, which is a continuation of application No. PCT/JP2004/001038, filed on Feb. 3, 2004.

(30) Foreign Application Priority Data

Feb. 5, 2003 (JP) .................................. 2003-28912

(51) Int. Cl.
*B32B 7/12* (2006.01)
*B32B 15/04* (2006.01)

(52) U.S. Cl.
USPC ........... 428/345; 428/142; 428/210; 428/343; 428/355 R

(58) Field of Classification Search
USPC .......................... 428/142, 210, 343, 345, 355
See application file for complete search history.

(56) References Cited

U.S. PATENT DOCUMENTS

| | | | |
|---|---|---|---|
| 4,687,693 A * | 8/1987 | Sheyon et al. | 428/148 |
| 5,637,395 A * | 6/1997 | Uemura et al. | 428/343 |
| 5,705,016 A | 1/1998 | Senoo et al. | |
| 6,258,426 B1 | 7/2001 | Yamamoto et al. | |
| 6,403,215 B1 | 6/2002 | Kondo et al. | |
| 6,602,599 B1 * | 8/2003 | Toyoda et al. | 428/355 AC |
| 2004/0241910 A1 * | 12/2004 | Matsumura et al. | 438/118 |
| 2005/0046042 A1 * | 3/2005 | Matsumura et al. | 257/782 |

FOREIGN PATENT DOCUMENTS

| | | | | |
|---|---|---|---|---|
| JP | 2-32181 A | 2/1990 | | |
| JP | 02248064 | * 10/1990 | | H01L 21/78 |
| JP | 7-45557 A | 2/1995 | | |
| JP | 7-235583 A | 9/1995 | | |
| JP | 8-53655 A | 2/1996 | | |
| JP | 9-298173 A | 11/1997 | | |
| JP | 09298173 | * 11/1997 | | H01L 21/304 |
| JP | 2002-158276 A | 5/2002 | | |
| JP | 2002158276 | * 5/2002 | | H01L 21/68 |
| JP | 3495388 B2 | 11/2003 | | |

OTHER PUBLICATIONS

Taiwanese Office Action dated Sep. 30, 2011, for Taiwanese Application No. 093102456.

* cited by examiner

*Primary Examiner* — Michael L Leonard
(74) *Attorney, Agent, or Firm* — Birch, Stewart, Kolasch & Birch, LLP

(57) ABSTRACT

A wafer-adhering adhesive tape, which has, on a surface of a base, a radiation-curable removable adhesive layer, and if necessary a die-bonding adhesive layer in order, wherein the radiation-curable removable adhesive layer is mainly composed of an acrylic-series copolymer having, in a principal chain, at least a radiation-curable carbon-carbon double bond containing group, a hydroxyl group, and a group containing a carboxyl group, respectively, and the radiation-curable removable adhesive layer has a gel fraction of 60% or greater.

10 Claims, No Drawings

WAFER-ADHERING ADHESIVE TAPE

This application is a Continuation of application Ser. No. 11/184,001, filed on Jul. 19, 2005 now abandoned and for which priority is claimed under 35 U.S.C. §120. Application Ser. No. 11/184,001 is a Continuation of PCT International Application No. PCT/JP2004/001038 filed on Feb. 3, 2004, which designates the United States, and on which priority is claimed under 35 U.S.C. §120. This application also claims priority under 35 U.S.C. §119(a) on Patent Application No. 2003-0028912 filed in Japan on Feb. 5, 2003. The entire contents of each of the above documents are hereby incorporated by reference.

TECHNICAL FIELD

The present invention relates to an adhesive tape that is provided with a removable adhesive agent layer on one side of a base film.

BACKGROUND ART

An assembling process of a semiconductor device, such as an IC or the like, comprises the steps of: cutting and separating (dicing) a semiconductor wafer and the like into respective chips, after patterning; mounting the chips on a substrate or the like; and sealing them with a resin or the like.

In the dicing step, a semiconductor wafer is adhered and fixed by an adhesive tape in advance, and then it is diced along a chip shape. In the mounting step, the chip is peeled off (picked up) from the adhesive tape and then fixed on a substrate or the like with an adhesive agent for adhering and fixing.

The tapes used for the above purposes include a usual pressure-sensitive adhesive-type tape, and a tape having a reduced adhesive force when it is hardened or cured by radiation, such as ultraviolet (UV) rays, electronic rays, and the like. Both of these types of tapes are required to have sufficient adhesive force so that the tape is not peeled off from the wafer upon dicing, and they are also required to have peeling capability to be easily peeled off from the wafer upon picking up.

Further, in the mounting step, sufficient adhesive force is required between the chip(s) and the substrate and the like.

There are suggested a variety of adhesive or adhesion tapes that are equipped with both of the function of a dicing adhesive tape used in the above process, and the function of an adhesive on a substrate and the like, which tapes are improved in the coating workability of the adhesive, and which simplify the whole process.

These adhesive tapes enable a so-called direct die bonding for, after dicing, picking up a chip with a removable adhesive layer adhered on the rear side of the chip, mounting the chip on a substrate or the like, and curing and adhering the chip by heating or the like. By these adhesive tapes, the coating process of an adhesive can be omitted.

However, the removable adhesion agent or adhesive agent used for these adhesive tapes is in a coating liquid state with low viscosity and low wettability to a tape base, and thus it has the problem of poor yield. Further, the above adhesion or adhesive agent is low in adhesion strength, compared with an existing adhesive or bonding agent for die bonding. Thus it is difficult to obtain reliability from the above adhesion or adhesive agent.

As means to obtain adhesion reliability and provide dicing performance, it is proposed to use a laminate of a die bonding adhesive layer and a dicing tape. However, this laminate-type tape has the problem that it is difficult to control the peeling ability between the adhesive and the dicing tape. A die bonding adhesive with high adhesion reliability generally requires heat adhesion upon temporarily fixing it to a wafer. However, the laminate-type tape has the problem of increase of peeling ability between the dicing tape and the die-bonding-sheet adhesive layer due to such a heat adhesion, thereby causing a raise of the pickup failure ratio after the dicing.

Further, it is also proposed that a die bond sheet is heat-adhered to a wafer in advance, and a dicing tape is laminated to the die bonding adhesive layer adhered to the wafer, before use. Also, in this case, a surface protective tape for back-grinding is usually bonded to a side of the wafer on which no die bonding sheet or dicing tape is bonded. To peel the surface protective tape from the wafer by lowering the adhesive force of the surface protective tape, a heat treatment is generally carried out. The heating temperature is generally about 40° C. or more, for example, about 60° C. Similarly to the above, this causes the problem of increased peeling force between the die bonding adhesive layer and the dicing tape.

DISCLOSURE OF THE INVENTION

The present invention resides in a wafer-adhering adhesive tape, which has a radiation-curable removable adhesive layer on a surface of a base,
wherein the radiation-curable removable adhesive layer is mainly composed of an acrylic-series copolymer having, in a principal chain, at least a radiation-curable carbon-carbon double bond containing group, a hydroxyl group, and a group containing a carboxyl group, respectively, and the radiation-curable removable adhesive layer has a gel fraction of 60% or greater.

Further, the present invention resides in a wafer-adhering adhesive tape, which has a radiation-curable removable adhesive layer and a die-bonding adhesive layer, in this order, on a surface of a base,
wherein the radiation-curable removable adhesive layer is mainly composed of an acrylic-series copolymer having, in a principal chain, at least a radiation-curable carbon-carbon double bond containing group, a hydroxyl group, and a group containing a carboxyl group, respectively, and the radiation-curable removable adhesive layer has a gel fraction of 60% or greater.

Other and further features and advantages of the invention will appear more fully from the following description.

BEST MODE FOR CARRYING OUT THE INVENTION

According to the present invention, there are provided the following means:
(1) A wafer-adhering adhesive tape, having a radiation-curable removable adhesive layer on a surface of a base, wherein the radiation-curable removable adhesive layer is mainly composed of an acrylic-series copolymer having, in a principal chain, at least a radiation-curable carbon-carbon double bond containing group, a hydroxyl group, and a group containing a carboxyl group, respectively, and the radiation-curable removable adhesive layer has a gel fraction of 60% or greater;
(2) A wafer-adhering adhesive tape, having a radiation-curable removable adhesive layer and a die-bonding adhesive layer, in this order, on a surface of a base, wherein the radiation-curable removable adhesive layer is mainly composed of an acrylic-series copolymer having, in a principal chain, at least a radiation-curable carbon-carbon double bond containing group, a hydroxyl group, and a group containing a carboxyl group, respectively, and the radiation-curable removable adhesive layer has a gel fraction of 60% or greater; and (3) The wafer-adhering adhesive tape according to the above item (1) or (2), wherein the ratio of carbon-carbon double bonds contained in the radiation-curable removable adhesive layer is 0.5 to 2.0 meq/g (milliequivalents/gram).

Herein, the term "being mainly composed of" means that a main component of a removable adhesive component in the radiation-curable removable adhesive layer, which layer is comprised of the removable adhesive component, a hardening agent and a polymerization initiator, is the acrylic-series copolymer having a carbon-carbon double bond containing group, a hydroxyl group, and a carboxyl group, respectively. Further, in the adhesive tape of the present invention, 60% by mass or more of the radiation-curable removable adhesive layer is generally composed of the acrylic-series copolymer having a carbon-carbon double bond containing group, a hydroxyl group, and a carboxyl group, respectively.

Further, herein, the "removable adhesive" means an agent capable of adhering and being removed after treatment such as curing, while an "adhesive" means an agent capable of adhering only. For example, the "radiation-curable removable adhesive" means a removable adhesive capable of being removed or pealed off by hardening by irradiation of radiation such as UV, after application of the removable adhesive to a wafer and the like.

The present invention will be described in detail below.

The present inventors have keenly studied to solve the above-described problems in the conventional adhesive or adhesion tapes. As a result, the present inventors found that defective picking-up does not occur, while maintaining sufficient adhesion reliability, by using an adhesive tape that comprises an adhesive or adhesion composition, which is mainly composed of an acrylic-series polymer having at least a radiation-curable carbon-carbon double bond containing group, a hydroxyl group, and a group containing a carboxyl group, respectively, in a principal chain, and which composition has a gel fraction of 60% or greater; and, if necessary, further laminating a die-bonding adhesive layer with the above adhesive tape. The present invention has been accomplished based on this finding.

The wafer adhering adhesive tape of the present invention can be made by forming a radiation curable removable adhesive layer on a base surface, in which the removable adhesive layer is mainly composed of the acrylic-series copolymer having at least a radiation curable carbon-carbon double bond containing group, a hydroxyl group and a carboxyl group-containing group, respectively, in the principal chain, and in which the adhesive layer has a gel fraction of 60% or greater. Further, in addition to the radiation curable removable adhesive layer, a die-bonding adhesive layer may be form on the base surface, and it is preferred to form the radiation curable removable adhesive layer and the die-bonding adhesive layer, in order, on the base surface.

The acrylic-series copolymer (hereinafter, referred to as "acrylic copolymer (A)") having at least a radiation curable carbon-carbon double bond containing group, a hydroxyl group, and a group containing a carboxyl group, respectively, in the principal chain, which copolymer can be used in the present invention, may be any one prepared by any manner. For example, the acrylic copolymer (A) can be obtained, by subjecting a copolymer (A1), which comprises a (meth) acrylic acid ester, a hydroxyl group-containing unsaturated compound, a carboxyl group-containing unsaturated compound, and the like, to addition reaction with a compound (A2) that has a functional group addition-reactive to a functional group in the copolymer (A1) and that has a carbon-carbon double bond, in which a carbon chain of the copolymer (A1) is to be a principal chain.

As the (meth)acrylic acid ester, included are, for example, hexyl acrylate, n-octyl acrylate, isooctyl acrylate, 2-ethylhexyl acrylate, dodecyl acrylate, decyl acrylate, each having 6 to 12 carbon atoms, or monomers having 5 or less carbon atoms, such as pentyl acrylate, n-butyl acrylate, isobutyl acrylate, ethyl acrylate, and methyl acrylate, or methacrylates like these. In this case, as the number of carbon atoms of monomers increases, the glass transition temperature becomes lower, thereby enabling manufacture of monomers of a desired transition temperature. Further, besides the glass transition temperature, for the purpose of enhancing compatibility and various performances, a low molecular compound having a carbon-carbon double bond, such as vinyl acetate, styrene, and acrylonitrile, can be blended within the range of 5% by mass or less.

Examples of the hydroxyl group-containing unsaturated compound include 2-hydroxyethyl acrylate, 2-hydroxyethyl methacrylate, 2-hydroxypropyl acrylate, 2-hydroxypropyl methacrylate, and the like.

Examples of the carboxyl group-containing unsaturated compound include acrylic acid, methacrylic acid, and the like.

As a functional group in the above-described compound (A2) having an addition reactive functional group and a carbon-carbon double bond, in a case that the functional group in the copolymer (A1) is a carboxyl group or a cyclic acid anhydride group, included are a hydroxyl group, an epoxy group, an isocyanato group, and the like; or in a case that the functional group in the copolymer (A1) is a hydroxyl group, included are a cyclic acid anhydride group, an isocyanato group, and the like; or in a case that the functional group in the copolymer (A1) is an amino group, included is an isocyanato group, and the like. Specific examples of the compound (A2) include acrylic acid, methacrylic acid, cinnamic acid, itaconic acid, fumaric acid, phthalic acid, 2-hydroxyalkyl acrylates, 2-hydroxyalkyl methacrylates, glycol monoacrylates, glycol monomethacrylates, N-methylol acrylamide, N-methylol methacrylamide, allyl alcohol, N-alkylaminoethyl acrylates, N-alkylaminoethyl methacrylates, acrylamides, methacrylamides, maleic anhydride, itaconic anhydride, fumaric anhydride, phthalic anhydride, glycidyl acrylate, glycidyl methacrylate, allyl glycidyl ether, and polyisocyanate compounds in which isocyanato groups are partially urethanated with a monomer having a hydroxyl group or carboxyl group and a photopolymerizable carbon-carbon double bond.

In the synthesis of the acrylic-series copolymer (A), when carrying out copolymerization by solution polymerization, a ketone-series, ester-series, alcohol-series, or aromatic-series solvent can be used as an organic solvent. Among these, a preferable solvent is a usual good solvent for an acrylic-series polymer, which solvent has a boiling point of 60 to 120° C. Examples of the preferable solvent include toluene, ethyl acetate, isopropyl alcohol, benzene methylcellosolve, ethylcellosolve, acetone, methyl ethyl ketone, and the like. As a polymerization initiator, use may be generally made of a radical generating agent of azobis-series, such as α,α'-azobisisobutyronitrile, and organic peroxide-series, such as benzoylperoxide. At this time, a catalyst, a polymerization inhibitor can be optionally added, if necessary. In this way, it is possible to obtain an acrylic-series copolymer (A) with a desired molecular weight, by controlling a polymerization temperature and a polymerization time, and then carrying out an addition reaction at a functional group. As for the control of the molecular weight, it is preferred to use a mercaptan-series or carbon tetrachloride-series solvent. Additionally, this copolymerization is not limited to a solution polymerization, but it may also be performed in other ways such as bulk polymerization, suspension polymerization, and the like.

As mentioned in the above, the acrylic-series copolymer (A) can be obtained. In the present invention, the mass average molecular weight of the acrylic-series copolymer (A) is preferably about 300,000 to about 1,000,000. If the molecular weight is too small, the cohesive force by irradiation of a radiation becomes lesser, thus a misalignment of elements (chips) may occur easily upon dicing the wafer, and image recognition may be difficult. Further, to prevent this misalignment of elements as much as possible, it is preferable that the molecular weight is 400,000 or more. If the molecular weight is too large, there is a possibility of gelation upon synthesis and coating. Further, as for properties of the copolymer, since the glass transition temperature is low, the flowability of the removable adhesive after irradiation of a radiation is not sufficient in a case of irradiation of a radiation not in a pattern shape but entirely, even if the molecular weight is large. Thus, although there occurs no such problems that an interval between elements is insufficient after stretching or that it is difficult to recognize an image upon picking up, the molecular weight is more preferably 900,000 or less. Herein, the molecular weight in the present invention means a mass average molecular weight in terms of polystyrene.

Further, in the present invention, an amount to be introduced of a photopolymerizable carbon-carbon double bond in the acrylic-series copolymer (A) may be varied according, for example, to use conditions thereof such as a UV irradiation amount and the like, and it is not limited, as long as it reaches an amount to give the effect of sufficiently lowering the adhesive force after radiation curing. The amount of the photopolymerizable carbon-carbon double bond to be introduced is preferably 0.5 to 2.0 meq/g, more preferably 0.8 to 1.5 meq/g. If the double bond amount is too small, the effect of reducing the adhesive ability after irradiation of a radiation becomes smaller. If the double bond amount is too large, the flowability of the removable adhesive after irradiation of a radiation is insufficient, thereby to make insufficient intervals between the resultant elements after stretching and make it difficult for each element to recognize an image upon picking up, in some cases. In this case, further, the acrylic-series copolymer (A) itself may be insufficient in stability and may be made difficult to manufacture.

In the present invention, the gel fraction of the radiation-curable removable adhesive layer can be controlled by the average molecular weight of the acrylic-series copolymer (A) and the amount of the hardening agent to be blended. The gel fraction is 60% or greater, and more preferably 80% or greater. If the gel fraction is too small, the removable adhesive component may be slightly moved on the contact interface, thus making it difficult to obtain stability on the peeling force with the lapse of time.

Further, the acrylic-series copolymer (A) has a hydroxyl group and a carboxyl group-containing group, each of which is unreacted, in the principal chain. It is preferable that the acrylic-series copolymer (A) has a hydroxyl group so that a hydroxyl group value is from 5 to 10, more preferably from 20 to 70, since the adhesive ability after irradiation of a radiation is reduced, to thus further decrease the risk of picking-up mistakes. Further, it is preferable that the acrylic-series copolymer (A) has a carboxyl group so that an acid value is from 0.5 to 30, since the tape recovery (restoration) ability is improved, to thus make it easy to cope with a tape housing-type mechanism for a used tape. The acid value is more preferably 1 to 10. In the meanwhile, if the hydroxyl group value of the acrylic-series copolymer (A) is too low, the adhesive ability after irradiation of a radiation is not sufficiently reduced, or if too high, the flowability of the removable adhesive after irradiation of a radiation is damaged. Further, if the acid value is too low, the tape recovery ability is not sufficiently improved, or if too high, the flowability of the removable adhesive is damaged.

Further, in case of hardening the radiation-curable removable adhesive layer for use in the present invention by ultraviolet irradiation, as an additional component, if necessary, use can be made of a photo polymerization initiator, such as isopropyl benzoin ether, isobutyl benzoin ether, benzophenone, Michler's ketone, chlorothioxanthone, dodecyl thioxanthone, dimethyl thioxanthone, diethyl thioxanthone, benzyl dimethyl ketal, α-hydroxycyclohexyl phenyl ketone, 2-hydroxymethylphenylpropane, and the like. The amount of the photo polymerization initiator to be blended is preferably 0.01 to 5 mass parts, to 100 mass parts of the acrylic-series polymer.

Further, the radiation curable removable adhesive layer may contain, if necessary, another additional component including, for example, a hardening agent such as a polyisocyanate compound and the like. The amount of the hardening agent to be blended is preferably 0.5 to 10 mass parts, to 100 mass parts of the acrylic-series polymer that is the main component.

The thickness of the radiation-curable removable adhesive layer is preferably 5 to 50 μm.

The base that can be used in the present invention may be a film of any material having a radiation transmission ability. Examples of the film include those made, for example, of a homopolymer or copolymer of an α-olefin, such as polyethylene, polypropylene, an ethylene/propylene copolymer, polybuten, an ethylene/vinyl acetate copolymer, an ethylene/acrylate copolymer, or an ionomer; an engineering plastic, such as polyethylene terephthalates, a polycarbonate, or poly(methyl methacrylate); or a thermoplastic elastomer, such as polyurethane, styrene/ethylene/buten, or a penten-series copolymer. Alternately, a mixture or double or higher layer of two or more kinds selected from the above compound group may be used.

The thickness of the base film to be used is preferably 50 to 200 μm.

By laminating the thus-obtained adhesive tape and a die-bonding adhesive, it is possible to make the wafer-adhering adhesive tape with higher performance. As the die-bonding adhesive, an acrylic/epoxy-series die bonding adhesive or the like can be used. By heat adhering the wafer-adhering adhesive tape to a semiconductor wafer, sufficient adhesive ability is obtained in the dicing step so not to peel off or remove the wafer, the die-bonding adhesive layer, the radiation-curable removable adhesive layer, and the base film each other. On the other hand, when picking up, the removable adhesive layer can be easily peeled off from chips attached to the die-bonding adhesive layer via radiation hardening.

Further, the similar effects can be exhibited by adhering the adhesive tape of the present invention, to the die-bonding adhesive layer side of the wafer with the die-bonding adhesive film attached thereto.

The peeling force of the die-bonding adhesive layer and the radiation-curable removable adhesive layer upon dicing is preferably 0.5 to 10 N/25 mm, and the peeling force between the chip attached to the die-bonding adhesive layer and the tape attached with the removable adhesive layer after irradiation of a radiation is preferably 0.5 to 0.05 N/25 mm.

In one preferable example of the present invention, the radiation curable removable adhesive layer and the die-bonding adhesive layer are formed on the surface of a base, in this order from the base side. In the die-bonding adhesive layer in the present invention, for example, a bonding adhesive gent which is usually used for die-bonding, such as a film-like bonding adhesive mainly composed of an epoxy resin, can be used. The thickness of the die-bonding adhesive layer is preferably 5 to 50 µm.

The wafer-adhering adhesive tape of the present invention has sufficient adhesive ability that the radiation-curable removable adhesive layer is not peeled off from a die-bonding adhesive layer and a wafer, when dicing; it allows easy removal of the removable adhesive layer and a chip attached to the die-bonding adhesive layer by radiation and hardening, when picking up; and it gives sufficient adhesive ability between the resultant chip and a substrate or the like, when mounting; thereby it enables a so-called direct die bonding Further, the wafer-adhering adhesive tape of the present invention can be used as a dicing tape upon dicing, and it can be used with the adhesive layer easily peeled off upon mounting, thereby to enable a direct die-bonding, and the wafer-adhering adhesive tape is excellent in storage stability. Further, when a die bonding sheet is heat-adhered to a wafer in advance and a dicing tape is laminated onto a die-bonding adhesive layer bonded to the wafer before use, the wafer-adhering adhesive tape of the present invention can be preferably used as the above dicing tape. Further, according to the wafer-adhering adhesive tape of the present invention, an interval between elements is sufficiently made after stretching, while obtaining the effects of reducing adhesive force after radiation hardening.

The present invention will be described in more detail based on the examples given below, but the present invention is not meant to be limited by these examples.

EXAMPLES

Examples 1 to 4

Synthesis of Acrylic-Series Copolymer A

A copolymer was prepared by solution radical polymerization of 65 mass parts of butyl acrylate, 25 mass parts of 2-hydroxyethyl acrylate, and 10 mass parts of acrylic acid, as raw materials. Then, to the thus-obtained copolymer, 2-isocyanatethyl methacrylate was added dropwise and reacted therewith, to prepare a copolymer A. In this manner, the amount of 2-isocyanatethyl methacrylate to be added dropwise and the reaction time of the solution radical polymerization are properly adjusted, to prepare copolymers A1 to A5, respectively, which were different in carbon-carbon double bond amounts and molecular weights.

(Preparation of a Wafer Adhering Adhesive Tape)

To the copolymers A1 to A5, a polyisocyanate compound (trade name: Coronet L, produced by Japan Polyurethane) as a hardening agent, and α-hydroxycyclohexyl phenyl ketone as a photo polymerization initiator were admixed in a mixing ratio, as shown in the following Table 1, to thereby obtain a radiation-curable removable adhesive, respectively.

Each of the removable adhesives was coated on a high-density polyethylene resin film (100 µm) such that the removable adhesive thickness after drying would be 10 µm, to prepare an adhesive tape, respectively. Each of these adhesive tapes and a film-like adhesive (for die bonding) mainly composed of an epoxy resin with 25-µm thickness were laminated at a room temperature, to prepare respective wafer-adhering adhesive tapes of Examples 1 to 4 and Comparative Example 1, as shown in Table 1.

(Properties Test)

As for the following properties 1 to 6 of the thus-prepared wafer adhering adhesive tapes, tests were carried out as described below. The test results are also shown in Table 1.

1. Gel Fraction

About 0.05 g of the removable adhesive layer was weighed, dipped in 50 ml of xylene for 24 hours at 120° C., then the resultant xylene was filtered through a stainless-steel metallic net of 200 meshes and insoluble constituents on the metallic net were dried for 120 minutes at 110° C. Then, the mass of the dried insoluble constituents was weighted, to estimate the gel fraction by the formula shown below:

Gel Fraction (%)=(Mass of insoluble constituents/Mass of weighed removable adhesive layer)×100

2. Removable Adhesive Double Bond Amount

The amount of carbon-carbon double bond contained in about 10 g of the heated and dried removable adhesive was measured and quantitatively determined by a mass increasing method by bromine addition reaction in a dark place in vacuo.

3. Expandability (Interval Between Elements)

The above-prepared wafer-adhering adhesive tape was heat adhered to a wafer for 10 seconds at 80° C., then a silicon wafer of a diameter of 5 inches was full-cut into a size of 3 mm×3 mm, and the thus-cut wafer was subjected to ultraviolet-radiation hardening (irradiation not on a pattern shape but on the entire wafer). Then, the resultant wafer was stretched in a wafer expanding machine (air pressure: 2.0 kg/cm$^2$), and the lengths of element intervals in longitudinal and transverse directions upon being stretched were measured, to estimate the average values. The lengths of element intervals included a blade thickness of 40 µm upon dicing.

The expandability is evaluated as below, based on the size (q) of element interval.

"○": q 100 µm: Image recognition of the element can be carried out satisfactorily.

"Δ": 100 µm>q 80 µm: It is difficult to carry out image recognition of the element.

"X": q<80 µm: It is impossible to carry out image recognition of the element.

4. Picking-Up Success Ratio

The above-prepared wafer-adhering adhesive tape was heat adhered to a wafer for 10 seconds at 80° C., and then diced to 10 mm×10 mm. Afterwards, ultraviolet rays of 200 mJ/cm$^2$ were irradiated to the removable adhesive layer by an air-cooling-type high-pressure mercury lamp (80 W/cm, irradiation distance: 10 cm). Then a picking-up test was carried out by a die bonder machine (produced by NEC Machinery, trade name: CPS-100FM), to obtain a picking-up success ratio at 100 picked-up chips.

5. Peeling Ability (Peeling Force)

Peeling ability before and after UV irradiation were measured according to JIS Z0237 (UV irradiation amount: 1000 mJ/cm$^2$). The wafer-adhering adhesive tape was heat adhered to a mirror surface of a silicon wafer heated to 80° C., and then the peeling force between the die-bonding adhesive layer and the adhesive tape was measured. The test was carried out under the conditions of a peeling angle of 90° and a peeling speed of 50 mm/min.

6. Storage Stability

The above-prepared wafer-adhering adhesive tape was heat adhered to a wafer for 10 seconds at 80° C., and diced to 10 mm×10 mm. Afterwards, ultraviolet rays of 200 mJ/cm$^2$ were irradiated to the removable adhesive layer by an aircooling-type high-pressure mercury lamp (80 W/cm, irradiation distance: 10 cm). Then, after the thus-irradiated wafer-adhering adhesive tape was stood for 2 weeks under room temperature conditions (25° C., 60% RH), the picking-up success ratio was obtained. Storage stability is evaluated and shown with this picking-up success ratio (%).

TABLE 1

|  | Example 1 | Example 2 | Example 3 | Example 4 | Comparative Example 1 |
|---|---|---|---|---|---|
| Kind of copolymer | A1 | A2 | A3 | A4 | A5 |
| Acid value (mgKOH/g) | 5.9 | 5.6 | 6.9 | 5.0 | 6.0 |
| Hydroxyl group value (mgKOH/g) | 55 | 34 | 40 | 34 | 50 |
| Amount of copolymer to be used (mass parts) | 100 | 100 | 100 | 100 | 100 |
| Amount of hardening agent to be used (mass parts) | 2 | 3 | 1.5 | 2 | 3 |
| Amount of photo polymerization initiator to be used (mass parts) | 1 | 1 | 1 | 1 | 1 |
| Gel fraction (%) | 90.5 | 91.3 | 68.2 | 86.7 | 50.8 |
| Removable adhesive double bond amount (meq/g) | 0.6 | 1.5 | 1.1 | 2.4 | 1.5 |
| Expandability (element interval) | ◯ | ◯ | ◯ | Δ | ◯ |
| Picking-up success ratio (%) | 100 | 100 | 100 | 100 | 100 |
| Peeling ability before UV irradiation (N/25 mm) | 1.20 | 1.31 | 1.29 | 1.13 | 1.34 |
| Peeling ability after UV irradiation (N/25 mm) | 0.21 | 0.11 | 0.16 | 0.14 | 0.21 |
| Storage stability (%) | 100 | 100 | 100 | 100 | 54 |

As can be seen from Table 1, Examples 1 to 3 according to the present invention showed that, in addition to that both of the picking-up success ratio and the storage stability were each 100%, the expandability was also good. Further, Example 4 indicated that the element interval upon expansion was slightly poor, but the picking-up success ratio and the storage stability were each 100%. Contrary to these, Comparative Example 1 showed that the storage stability was conspicuously poor.

From these results, it can be understood that the wafer-adhering adhesive tape of the present invention can be used as a dicing tape upon dicing, and it can be used with the adhesive layer easily peeled off upon mounting, to thereby enable a direct die-bonding, and that the inventive wafer-adhering adhesive tape is excellent in storage stability.

Separately, an example of the wafer-adhering adhesive tape, in which the ratio of a carbon-carbon double bond contained in the radiation-curable removable adhesive layer was too low, was prepared and tested in the same manner as Example 1, excepted that the ratio of carbon-carbon double bond was changed to 0.3 meq/g. As a result, the picking-up success ratio obtained in this example was 25%. At this time, the peeling forces before and after UV irradiation were 1.42 N/25 mm and 0.4 N/25 mm, respectively.

Example 5

The removable adhesive same as that in Example 1 was coated on a high-density polyethylene resin film (thickness: 100 μm) such that the adhesive thickness after drying would be 10 μm, to prepare an adhesive tape. Separately, a silicon wafer of 5-inch diameter, on which a surface protective tape for grinding was attached, was provided. To a ground surface of the wafer, on which surface no protective tape was attached, a film-like adhesive (for die bonding) with 25-μm thickness was heat adhered for 10 seconds at 80° C. The above-prepared adhesive tape was attached to a (die-bonding) adhesive layer attached to the wafer. Then, the resultant silicon wafer adhered with the adhesive tape was subjected to heat treatment for 100 seconds at 60° C., to peel off the surface protective tape from the wafer.

Afterwards, in the same manner as to Example 1, this silicon wafer was full-cut into a size of 3 mm×3 mm, UV-irradiation hardened, and expanded, and then subjected to the picking-up test. As a result, good expandability and picking-up property, as in Example 1, were exhibited. Further, it was found that the storage stability of the adhesive tape was also good.

As seen from above, when a die-bonding sheet is heat adhered to a wafer in advance and then the adhesive tape of the present invention is adhered and laminated to the resultant die-bonding adhesive layer attached to the wafer, the adhesive tape of the present invention can also be preferably used.

INDUSTRIAL APPLICABILITY

The wafer-adhering adhesive tape of the present invention is preferable, for example, as a semiconductor wafer-adhering adhesive tape that is used in an adhering process for fixing a wafer or the like, dicing it, and lap-jointing it with a substrate or a semiconductor chip, when a semiconductor device, such as a silicon wafer or the like, is manufactured.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A wafer-adhering adhesive tape having a radiation-curable removable adhesive layer on a surface of a base and a second die-bonding adhesive layer on the radiation-curable adhesive layer,
   wherein the radiation-curable removable adhesive layer cross-linked by a hardening agent, can be peeled off from the die-bonding adhesive layer by irradiation,
   wherein, before irradiation, the radiation-curable removable adhesive layer consists of an acrylic-series copolymer and a polymerization initiator,
   wherein the acrylic-series copolymer has, in a principal chain, at least a radiation-curable carbon-carbon double bond containing group, a hydroxyl group, and a group containing a carboxyl group, respectively, and wherein said radiation-curable removable adhesive layer has a gel fraction of 60% or greater.

2. The wafer-adhering adhesive tape according to claim 1, wherein the amount of carbon-carbon double bonds contained in the radiation-curable removable adhesive layer is 0.5 to 2.0 meq/g.

3. The wafer-adhering adhesive tape according to claim 1, wherein the die-bonding adhesive layer is composed of an acrylic/epoxy-series die bonding adhesive.

4. The wafer-adhering adhesive tape according to claim 2, wherein the die-bonding adhesive layer is composed of an acrylic/epoxy-series die bonding adhesive.

5. The water-adhering adhesive tape according to claim 1, wherein the acrylic-series copolymer has an isocyanato group.

6. The wafer-adhering adhesive tape according to claim 5, wherein the amount of carbon-carbon double bonds contained in the radiation-curable removable adhesive layer is 0.5 to 2.0 meq/g.

7. The wafer-adhering adhesive tape according to claim 5, wherein the die-bonding adhesive layer is composed of an acrylic/epoxy-series die bonding adhesive.

8. The wafer-adhering adhesive tape according to claim 6, wherein the die-bonding adhesive layer is composed of an acrylic/epoxy-series die bonding adhesive.

9. A method for producing semiconductor chips from a wafer, comprising:
   securing a wafer to a base with the wafer-adhering adhesive tape according to claim 1, wherein the radiation curable removable adhesive layer contacts the base;
   dicing the wafer into chips;
   irradiating; and
   picking up each chip from the tape.

10. A method for preparing the wafer-adhering adhesive tape according to claim 1, comprising:
   forming the radiation radiation-curable removable adhesive layer on a surface of a base; and
   forming a die-bonding adhesive layer on said radiation-curable removable adhesive layer.

* * * * *